United States Patent
Riviere-Cazaux

(10) Patent No.: US 8,239,799 B2
(45) Date of Patent: Aug. 7, 2012

(54) PLACING FILLER CELLS IN DEVICE DESIGN BASED ON DESIGNATION OF SENSITIVE FEATURE IN STANDARD CELL

(75) Inventor: Lionel J. Riviere-Cazaux, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 224 days.

(21) Appl. No.: 12/683,684

(22) Filed: Jan. 7, 2010

(65) Prior Publication Data

US 2011/0167396 A1 Jul. 7, 2011

(51) Int. Cl.
*G06F 17/50* (2006.01)

(52) U.S. Cl. ........ 716/113; 716/115; 716/122; 716/132; 716/139

(58) Field of Classification Search ............ 716/113, 716/115, 139
See application file for complete search history.

(56) References Cited

U.S. PATENT DOCUMENTS

| | | | | |
|---|---|---|---|---|
| 5,475,607 A * | 12/1995 | Apte et al. | | 716/113 |
| 5,790,841 A * | 8/1998 | Scherer et al. | | 713/503 |
| 6,266,803 B1 * | 7/2001 | Scherer et al. | | 716/114 |
| 6,463,571 B1 * | 10/2002 | Morgan | | 716/115 |
| 6,898,769 B2 * | 5/2005 | Nassif et al. | | 716/115 |
| 7,225,423 B2 * | 5/2007 | Bhattacharya et al. | | 716/102 |
| 7,346,867 B2 * | 3/2008 | Su et al. | | 716/115 |
| 7,584,449 B2 * | 9/2009 | Beerel et al. | | 716/104 |
| 7,600,208 B1 * | 10/2009 | Sharma et al. | | 716/120 |
| 7,673,260 B2 * | 3/2010 | Chen et al. | | 716/106 |
| 7,716,612 B1 * | 5/2010 | Gupta et al. | | 716/132 |
| 7,805,697 B2 * | 9/2010 | Wood | | 716/113 |
| 7,823,102 B2 * | 10/2010 | Chandra et al. | | 716/106 |
| 7,882,471 B1 * | 2/2011 | Kariat et al. | | 716/113 |
| 2005/0229142 A1 * | 10/2005 | Boppana et al. | | 716/17 |
| 2005/0251775 A1 * | 11/2005 | Wood | | 716/10 |
| 2007/0028193 A1 * | 2/2007 | Correale et al. | | 716/1 |
| 2007/0094623 A1 * | 4/2007 | Chen et al. | | 716/4 |
| 2009/0019411 A1 * | 1/2009 | Chandra et al. | | 716/9 |
| 2009/0083691 A1 * | 3/2009 | Penzes | | 716/18 |
| 2009/0144687 A1 * | 6/2009 | Andou | | 716/10 |
| 2009/0254874 A1 * | 10/2009 | Bose | | 716/6 |

OTHER PUBLICATIONS

Sadra, K. et al., "Variations in timing and leakage power of 45nm library cells due to lithography and stress effects," SPIE2009, Advanced Lithography 2009, vol. 7271-7275, 10 pages.

Sadra, K. et al., "Variations in timing and leakage power of 45nm library cells due to lithography and stress effects," Presentation Slides, SPIE2009, Feb. 26, 2009, 14 pages.

* cited by examiner

*Primary Examiner* — Naum Levin

(57) ABSTRACT

An instantiation of a standard cell is placed at a location of a device design. The standard cell includes a designation identifying a sensitive feature of the standard cell. An instantiation of a filler cell is placed at a selective location of the device design based on the designation.

20 Claims, 8 Drawing Sheets ously to the design of data processing devices.

PLACING FILLER CELLS IN DEVICE DESIGN BASED ON DESIGNATION OF SENSITIVE FEATURE IN STANDARD CELL

FIELD OF THE DISCLOSURE

The present disclosure relates generally to data processing devices, and more particularly to the design of data processing devices.

BACKGROUND

Modern integrated circuit data processing devices can include large numbers of transistors. Consequently, design engineers typically make use of design automation tools and associated techniques to increase their design productivity. For example, an integrated circuit data processing device can be implemented using logic components known as standard cells, which the designer selects from a predefined standard cell library. Automated standard cell placement and signal routing tools can be used to assemble a virtual representation of the physical integrated circuit data processing device by instantiating and interconnecting symbolic representations of the standard cell circuitry at a computer-aided design (CAD) system. The virtual representation of the device can be designed and evaluated using the CAD system, and can then be used to manufacture the integrated circuit data processing device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

As disclosed herein, placement of standard cells at a data processing device is determined based on a designation that can be associated with a symbolic representation of a standard cell. The designation identifies a location at the standard cell of a feature that can be affected by another feature in proximity to the standard cell. For example, the designation can identify the location of a transistor of a standard cell having a performance attribute that can be adversely affected by the placement of an adjacent standard cell. In an embodiment, filler cells can be placed adjacent to the standard cell based on the location of the standard cell's designation to reduce or prevent the effects of adjacent transistors, or other feature, on the standard cell. In another embodiment, a filler cell can be placed adjacent to the standard cell based on a location of the standard cell's designation to reduce or prevent the effects of an adjacent transistor, or other feature, when the standard cell including the designation is included in a logic path that is identified as a critical timing path.

A feature whose operation is subject to being affected by the presence of an adjacent feature can be referred to as a sensitive feature. A feature whose presence affects a sensitive feature can be referred to as an aggressor feature. An aggressor feature can affect an attribute of a sensitive feature at an adjacent standard cell and thereby affect the operation of the adjacent standard cell. For example, an aggressor feature can affect the timing, the sub-threshold leakage, or another attribute of an adjacent standard cell. A sensitive feature can include an active device, such as a transistor. Thus, an aggressor feature located in proximity to a transistor identified as a sensitive feature can affect the operation of the transistor. An aggressor feature can be classified as an active aggressor feature or a passive aggressor feature. An example of a passive aggressor feature is a shallow-trench-isolation (STI) region that can exert a form of material stress on device channel areas in the vicinity to the STI region. An example of an active aggressor feature is a conductor at an adjacent standard cell capable of coupling excessive levels of signal noise to a sensitive feature. The present disclosure provides techniques for improving the performance of an integrated circuit data processing device by placing a filler cell adjacent to a standard cell that includes a sensitive feature, wherein the filler cell does not include an aggressor feature relative to the sensitive feature. The filler cell may or may not include any functional devices.

Figure 1:
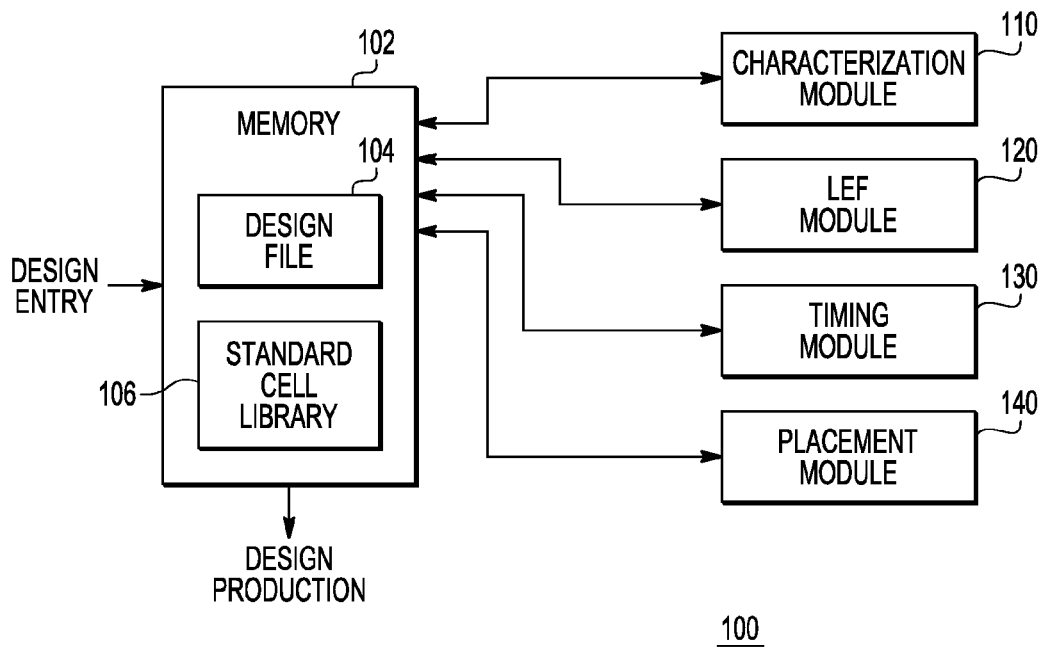
FIG. 1 is a block diagram illustrating a data processing device design system including computer-aided design (CAD) application modules in accordance with a specific embodiment of the present disclosure.

FIG. 1 is a block diagram illustrating a data processing device design system 100 including computer-aided design (CAD) application modules in accordance with a specific embodiment of the present disclosure. Design system 100 is operable to facilitate the design of a data processing device. Design system 100 includes a memory 102, a characterization module 110, a layout exchange format (LEF) module 120, a timing module 130, and a placement module 140. Memory 102 includes a design file 104 and a standard cell library 106. The representation of the data processing device at design system 100 is referred to herein as a device design.

In one embodiment, application modules 110, 120, 130, and 140 are CAD software modules that can each be executed as described herein to perform an associated design function. Characterization module 110 is operable to evaluate a standard cell of a standard cell library to determine if the standard cell includes a sensitive feature. For example, characterization module 110 can simulate the effects that an adjacent aggressor feature could have on the timing characteristics of the standard cell. LEF module 120 is operable to annotate a symbolic representation of a standard cell that has been determined to include a sensitive feature with one or more designations that identify the location of each sensitive feature within the layout of the standard cell being evaluated. These designations are referred to as LEF designations. Timing module 130 is operable to analyze the timing characteristics of logic paths included at a device design where a logic path typically includes multiple standard cells. The timing module can be used to determine if, and by what margin, each logic path satisfies a desired operating frequency goal. Placement module 140 is operable to determine the placement (physical location) of each standard cell at an integrated circuit. The placement of standard cells is based on the presence and location of LEF designations at the standard cells being placed. For example, placement module 140 can place a filler cell adjacent to a standard cell having a LEF designation to assure that a standard cell having an aggressor feature is not located in a close enough proximity to the location of the LEF designation of the standard cell to affect an attribute of the sensitive feature of the standard cell to a significant degree. The various modules will be discussed in detail below.

A standard cell library 106 includes a plurality of pre-defined standard cells that can include logic devices and analog devices that can be used in a device design to implement an integrated circuit data processing device. A standard cell typically includes multiple models and views (viewpoints) that are provided to represent various aspects of the standard cell. For example, a standard cell can include a functional model that documents the logic operation performed by the standard cell, a timing model that provides signal propagation information for the standard cell, a circuit netlist that describes the transistor level connectivity of the standard cell, and physical views, such as a LEF view, that describes physical attributes of the standard cell such as the location of physical interface terminals. A device design stored at design file 104 is defined by instantiations that reference standard cells from the standard cell library. For example, a counter device can be implemented using one or more instantiations of a specific flip flop and combinatorial logic gates included at a standard cell library.

Design file 104 represents one or more databases used for storing a representation of a device design, such as a data processing device, and its associated attributes. Design file 104 is stored at memory 102 and can receive design-entry information from design engineers and additional design properties and parameters from associated databases. Design file 104 can include an application programming interface (API) to permit the CAD application modules to access and manipulate device design attribute. A device design at design file 104 can represent a device using one or more models and views. For example, the device design can include a register-transfer level (RTL) model that provides a functional description of the device, a gate level representation of the device, and a transistor level representation of the device. Design file 104 can include additional device design attributes such as any information that a design engineer and the CAD application modules need to develop and model the device. When the design process is complete, the information stored at design file 104 can be used for production of the data processing device. For example, design file 104 can include a representation of a data processing device design and the device design can include information relating to physical photomask features that is provided to an integrated circuit manufacturing facility.

Design system 100 includes application modules that are configured to manipulate device design information. An application module can be a software program configured to perform a particular portion of the methods disclosed herein. Each of the application modules, including modules 110, 120, 130, and 140 can manipulate device design information included at design file 104 to transform the representation of the device in a desired way.

Characterization module 110 is operable to analyze the operation of a standard cell. In one implementation, characterization module 110 can analyze the operation of a standard cell based on a transistor-level netlist model of the standard cell to simulate the effect that an adjacent aggressor feature would have on the timing behavior of the standard cell. For example, characterization module 110 can perform a plurality of simulations for a standard cell, one simulation for each time an electrical characteristic of the standard cell is manipulated in a manner representing the possible effect of an aggressor cell, to identify sensitive features at the standard cell. For example, characterization module 110 can simulate operation of a standard cell after manipulating a speed characteristic of a transistor of the standard cell to determine the effect of the manipulation. A feature can be marked as a sensitive feature when a particular manipulation affects the overall performance of the standard cell by a more than a desired amount. In another implementation, characterization module 110 can analyze the operation of a standard cell based on a model of the standard cell that includes attributes associated with the physical layout of the standard cell. For example, the capacitance of conductors included at the standard cell and the effects of mutual capacitance between features of the standard cell can be determined using a parametric extraction design tool (not shown at FIG. 1). Thus, characterization module 110 can simulate the effect aggressor features, such as features associated with another standard cell that can potentially be located in substantially close proximity to the standard cell being characterized. In either implementation, characterization module 110 can use transistor level circuit modeling procedures to determine a set-up time of an input at the standard cell, a rate at which an output of the standard cell transitions based on a set of output loads, and other operational characteristics of the standard cell. Furthermore, characterization module 110 can determine if the effect that an aggressor feature has on a sensitive feature at the standard cell results in a significant affect on the behavior of the standard cell. For example, a variation in a characteristic of a device at a standard cell may or may not have a significant affect on the operation of the standard cell as a whole. Results of the characterization procedure can be stored at standard cell library 106 at memory 102.

Characterization module 110 can determine the operating characteristics of each standard cell at standard cell library 106 based on a contextual assumption as to the manner in which the standard cell will be placed at an integrated circuit. Generally, each standard cell is typically characterized as if it were placed in a single context, such as a worst-case context, despite the fact that the actual placement context of each instantiation of the standard cell at the integrated circuit can vary considerably. Therefore, the behavior of a standard cell can be characterized assuming a worst-case context that may rarely be experienced, which results in the need for excess design margin in most timing paths and a corresponding reduction in the computational performance of the device. Alternatively, the present disclosure provides techniques to prevent a standard cell from being placed in a particularly adverse context, thereby permitting the standard cell operation to be characterized using less adverse contextual assumption. For example, the standard cell can be characterized in a context that includes a filler cell will always be placed adjacent to a sensitive feature at the standard cell.

LEF module 120 is operable to annotate a LEF view of each standard cell with one or more designations that identify the location of sensitive features within a standard cell, as determined by characterization module 110. A LEF view of a standard cell can include only particular physical information that is required by physical layout-oriented application modules, such as placement module 140. The LEF view of a standard cell can be better understood with reference to FIG. 4 below.

Timing module 130 is operable to determine the timing characteristics of a device design, including the timing behavior of each synchronous logic path included at the device design. The timing behavior of a logic path includes timing slack, wherein a positive timing slack value indicates that the timing performance of a logic path exceeds the performance required by the frequency of an associated clock signal, and a negative slack value indicates that the timing performance of the logic path fails to meet the performance required by the frequency the associated clock. The timing information determined by timing module 130 can be used to further guide placement module 140 in determining whether filler cells are to be placed adjacent to a standard cell containing a sensitive feature. For example, placement module 140 need not place a filler cell adjacent to a standard cell having a sensitive feature if the logic patch that includes the standard cell has sufficient positive slack such that the timing slack remains positive despite the adverse effect of an aggressor feature adjacent to the standard cell. Conversely, if a logic path that includes a standard cell having a sensitive feature has limited or insufficient positive slack, placement module 140 can place filler cells adjacent to the standard cell, thereby ensuring a less adverse context for each standard cell of the timing path.

Placement module 140 is operable to determine placement of each standard cell of a data processing device design. Placement of a standard cell can be based on a designation that can be included at a corresponding LEF view of each standard cell. Placement module 140 can place a filler cell adjacent to the standard cell based solely on the presence and on the location of a designation at the standard cell having a sensitive feature. Alternatively, placement module 140 can place a filler cell adjacent to a standard cell having a designation only when that standard cell is associated with a logic path that does not have a sufficient positive timing slack. The operation of each application module can be better understood with reference to FIGS. 2-7, which are described below.

Figure 2:
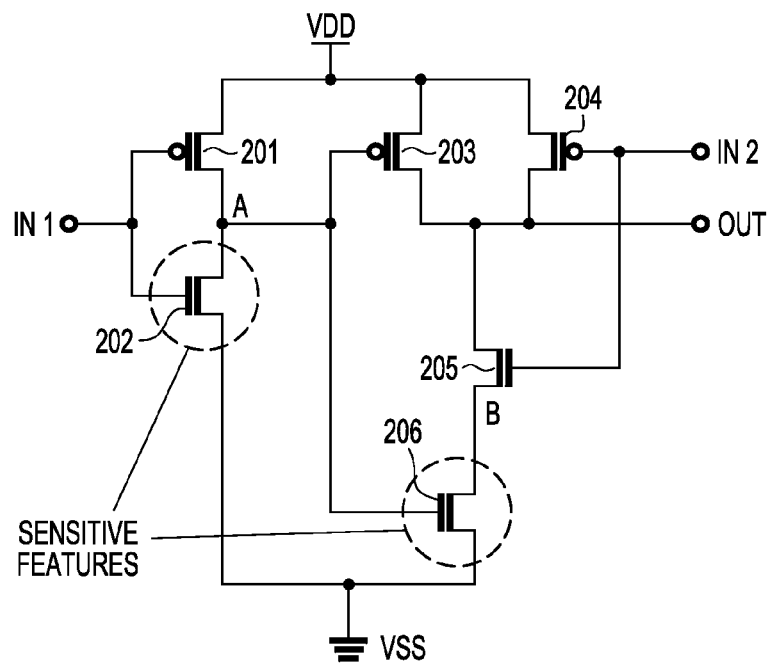
FIG. 2 is a schematic diagram illustrating a standard cell in accordance with a specific embodiment of the present disclosure.

FIG. 2 is a schematic diagram illustrating a standard cell 200 in accordance with a specific embodiment of the present disclosure. Standard cell 200 is representative of a standard cell included at standard cell library 106 of FIG. 1. A schematic diagram, such as that illustrated, specifies how individual transistors that make up the standard cell are interconnected in addition to other attributes (not shown at FIG. 2) such as the size of each transistor, and can be referred to a transistor netlist of the standard cell.

Standard cell 200 includes three p-channel field effect transistor (FET) devices including transistors 201, 203, and 204, and three n-channel FET devices including transistors 202, 205, and 206. Transistor 201 has a source connected to a voltage reference node labeled VDD, a gate connected to an input node labeled IN1, and a drain connected to a node labeled A. Transistor 202 has a drain connected to node A, a gate connected to node IN1, and a source connected to a voltage reference node labeled VSS. Transistor 203 has a source connected to voltage reference node VDD, a gate connected to node A, and a source connected to a node labeled B. Transistor 204 has a source connected to voltage reference node VDD, a gate connected to an input node labeled IN2, and a source connected to an output node labeled OUT. Transistor 205 has a drain connected to node OUT, a gate connected to node IN2, and a source connected to a node labeled B. Transistor 206 has a drain connected to node B, a gate connected to node A, and a source connected to voltage reference node VSS. While field effect transistors such as metal oxide semiconductor field effect transistors (MOSFETs) are illustrated at FIG. 2, another transistor technology, such as junction-FET or bipolar can be used without departing from the scope of the present disclosure.

During operation of design system 100, characterization module 110 can receive a transistor level netlist of a standard cell, such as standard cell 200, and analyze the operation of the standard cell. For example, characterization module 110 can determine the rate at which transistors 201-206 switch for a given input, and thus determine the delay and a transition rate at which a signal at output node OUT occurs in response to a signal transition at input nodes IN1 and IN2. Furthermore, characterization module 110 can identify whether the standard cell includes one or more sensitive features that when affected by an aggressor feature would adversely effect the overall operation of the standard cell. In an embodiment, characterization module 110 can identify the presence of sensitive features at the standard cell based on a physical (layout) view information associated with of the standard cell. For example, characterization module 110 can determine that conductors that run parallel to, and near, a perimeter of the standard cell are more susceptible to cross-coupling from an adjacent standard cell than interconnects further from the perimeter of the standard. For the purpose of illustration, it is assumed that characterization module 110 has determined that transistor 202 and transistor 206 are sensitive features, and that changes to the switching characteristics of these devices due to a proximate aggressor features adversely affects the rate at which a signal propagates from an input node, such as IN1, to output node OUT.

Figure 3:
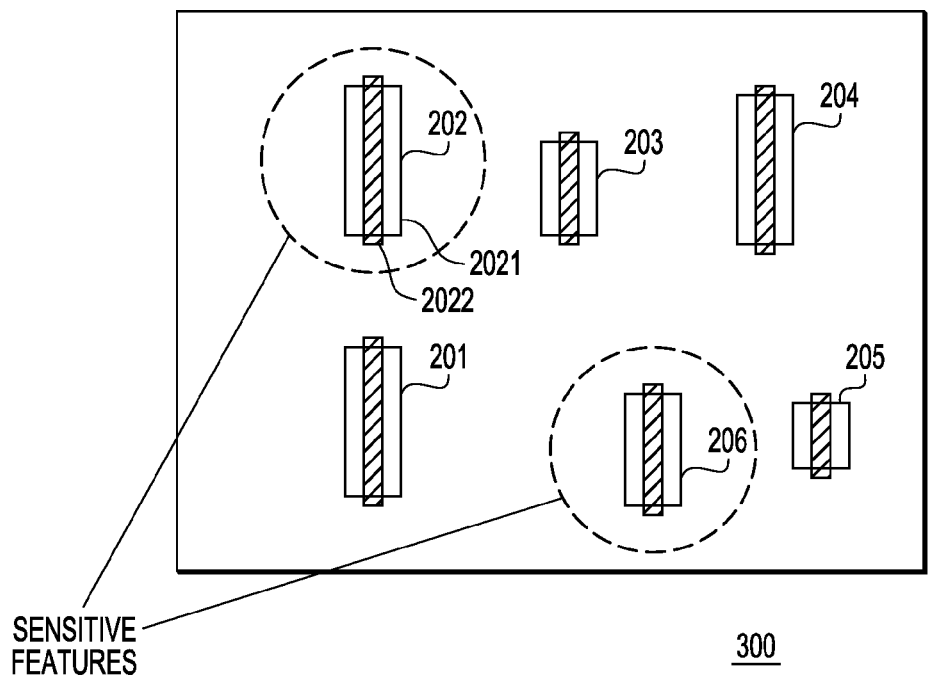
FIG. 3 is a block diagram illustrating a layout view of the standard cell of FIG. 2 in accordance with a specific embodiment of the present disclosure.

FIG. 3 is a block diagram illustrating a layout view 300 of standard cell 200 of FIG. 2 in accordance with a specific embodiment of the present disclosure. A layout view of a standard cell is a physical view that includes a plurality of polygonal objects representative of corresponding photomask information used to implement the devices included at the standard cell, such as diffusion areas, gate electrode areas, metal interconnects, contacts, and the like. Layout view 300 is a simplified layout view of standard cell 200 depicting features associated with transistors 201-206. For example, layout view 300 includes polygons representing the transistor drain/source (diffusion) area of each transistor, such as polygon 2021, and the transistor gate area of each transistor, such as polygon 2022. Metal traces and other conductors that serve to interconnect transistors 201-206 are not show at FIG. 3 for clarity. The locations of sensitive features corresponding to transistor 202 and transistor 206 are identified.

As previously discussed, layout view 300 is one of a plurality of design models and views used to represent a data processing device and maintained at design file 104. Layout view 300 includes information describing the location of each device at the integrated circuit, such as the location of the sensitive features associated with transistor 202 and transistor 206. Having identified each sensitive feature at a standard cell using characterization module 110, and having determined the location of each sensitive feature using a corresponding layout view of each standard cell, such as layout view 300, a designation can be provided to a symbolic representation of the standard cell that includes a sensitive feature, such as to a LEF view associated with each standard cell.

Figure 4:
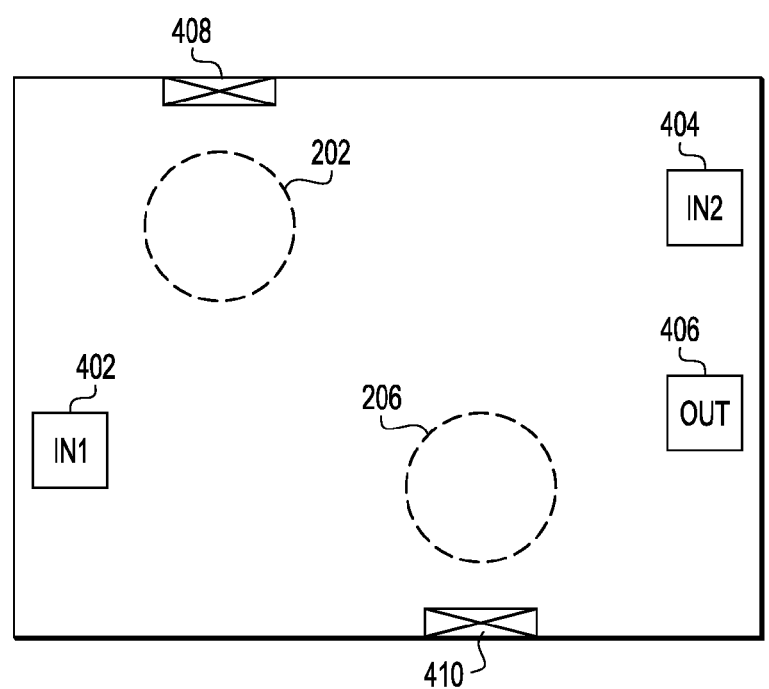
FIG. 4 is a block diagram illustrating a LEF view of the standard cell of FIG. 2 in accordance with a specific embodiment of the present disclosure.

FIG. 4 is a block diagram illustrating a LEF view 400 of standard cell 200 of FIG. 2 in accordance with a specific embodiment of the present disclosure. A LEF view is a physical view of a standard cell and is an example of a symbolic representation of the standard cell. A LEF view of the standard cell can be placed adjacent to the LEF view of another standard cell of an integrated circuit data processing device design using a placement application module, much like tiles of a floor. A LEF view of a standard cell, such as LEF view 400, can include only particular physical information that is needed by physical layout-oriented application modules, such as placement module 140 and automated signal routing modules (not shown at FIG. 1) to execute their respective functions. For example, LEF view 400 includes designators representing the location of input and output terminals, such as input nodes IN1 and IN2 and output node OUT. For example, a designator 402, illustrated as an icon, represents the location of a terminal associated with input node IN1, a designator 404 represents the location of a terminal associated with input node IN2, and a designator 406 represents the location of a terminal associated with output node OUT. LEF view 400 also includes sensitive feature designations (illustrated as icons) provided by LEF module 120, including an icon 408 and an icon 410, which identify the location of sensitive features associated with transistor 202 and transistor 206, respectively. In an embodiment, a sensitive feature designation can include a size attribute that can be adjusted to represent the relative size of the sensitive feature at the standard cell.

LEF module 120 is an application module of design system 100 that is configured to annotate the LEF view of each standard cell that contains a sensitive feature with a sensitive feature icon (designation) corresponding to each sensitive feature. LEF module 120 can specify that each sensitive feature icon be at the edge of the LEF view of a standard and at a location that is adjacent to a corresponding sensitive feature, the location determined by a layout view of the standard cell, such as layout view 300 of standard cell 200. For example, icon 408 is provided at LEF 120 in close proximity to transistor 202, and icon 410 is provided in close proximity to transistor 206. Placement module 140 can use the location of sensitive feature icons at a standard cell to constrain placement of other standard cells adjacent to that standard cells. For example, placement module 140 can place a filler cell adjacent to the location of a sensitive feature icon at a standard cell, and in so doing, prevent another standard cell that contains an aggressor feature from being placed adjacent to the sensitive feature, such as transistors 202 and 206 at that standard cell.

A sensitive feature designator can be provided at a location other than the edge of the LEF view of a standard cell. For example, the location of a sensitive feature icon can correspond to the center of the sensitive feature, or the icon can be positioned at another suitable location that allows a placement application module to constrain placement of other standard cells in close proximity to the corresponding sensitive feature. Furthermore, a sensitive feature designation can include another polygon shape or may include a single coordinate location at the standard cell LEF view. The annotated LEF information is stored at memory 102 after it is annotated by LEF module 120. In an embodiment, the symbolic representation of a standard cell can include a data file, such as a text file. LEF module 120 can identify the location of a sensitive feature at the standard cell and represent the location at the data file accordingly. Placement module 140 can reference the symbolic representation associated with each standard cell at standard cell library 106.

Figure 5:
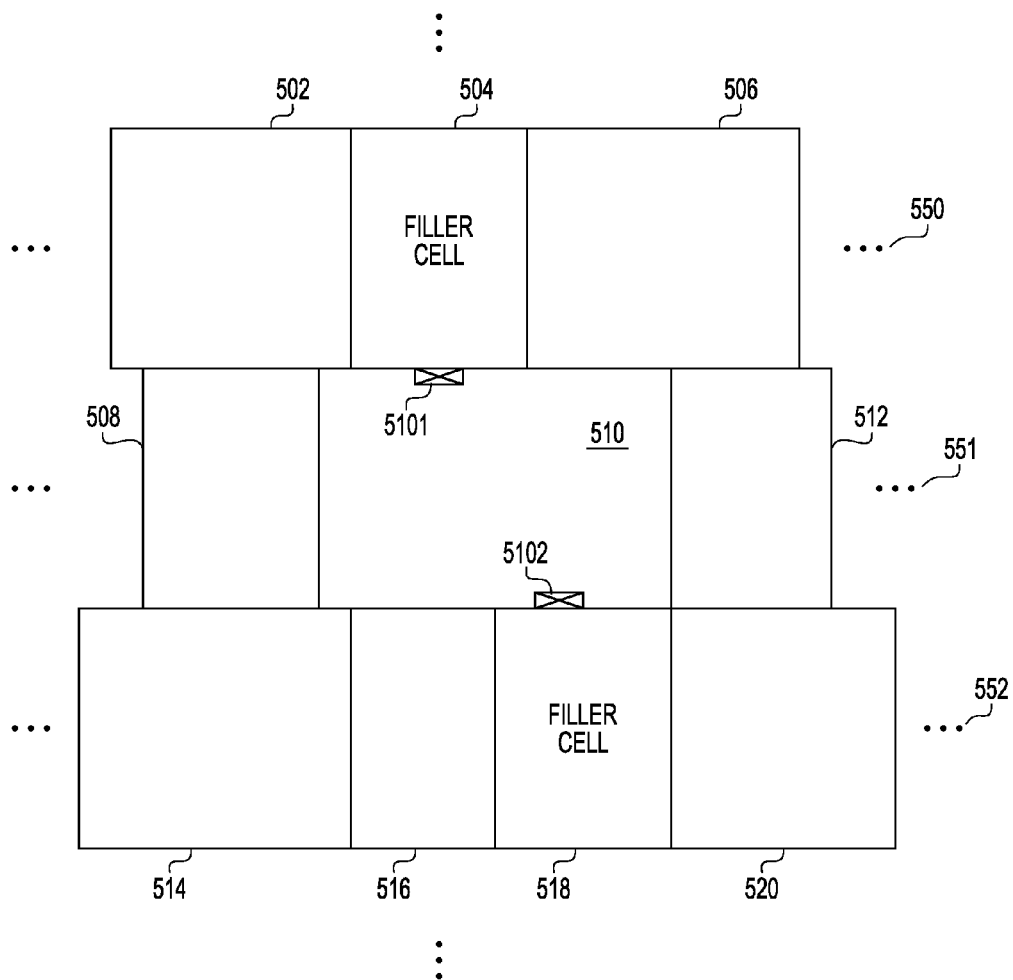
FIG. 5 is a block diagram illustrating a standard cell placement view of an integrated circuit data processing device design in accordance with a specific embodiment of the present disclosure.

FIG. 5 is a block diagram illustrating a standard cell placement view 500 of an integrated circuit data processing device design in accordance with a specific embodiment of the present disclosure. Standard cell placement view 500 includes instantiations of standard cell LEF symbols, each LEF symbol (view) corresponding to an instantiation of a standard cell circuit that is be manufactured at that location of an integrated circuit. A placement application module, such as placement module 140, can provide the placement of individual LEF symbols at the device design. Standard cell placement view 500 includes standard cell LEF symbol 502, 502, 506, 508, 510, 512, 513, 516, 518, and 520, arranged at three rows, including row 550, 551, and 552. LEF symbol 510 includes sensitive feature designation 5101 and sensitive feature designation 5102. For the purpose of discussion, LEF symbol 510 can represent LEF view 400 of standard cell 200 previously described with reference to FIGS. 2-4, and sensitive feature designations 5101 and 5102 correspond to icons 408 and 410, respectively. Placement view 500 represents only a portion of a complete integrated circuit design, which can include hundreds of thousands of individual standard cells.

Standard cells are typically organized in a plurality of rows at an integrated circuit data processing device design, wherein the height of each standard cell is typically the same as, or an integer multiple of, the height of the majority of other cells included at the standard cell library. The width of each standard cell can vary depending on the number and size of transistor devices included at the standard cell. Placement module 140 can determine the relative placement of standard cells in part based on the connectivity of each standard cell to other standard cells. Furthermore, in an embodiment, placement module 140 is configured to place a filler cell adjacent to a standard cell having a sensitive feature designation. In particular, filler cells can be placed at selective locations immediately adjacent to the sensitive feature designation at the standard cell, and are not placed at other locations adjacent to the standard cell that do not have a corresponding sensitive feature designation.

For example, the standard cell corresponding to LEF symbol 510 includes two sensitive features indicated by designation 5101 and designation 5102. Accordingly, placement module 140 places a filler cell, represented by LEF symbol 504, adjacent to designation 5101 and places a filler cell, represented by LEF symbol 518, adjacent to designation 5102. Thus, placement module 140 is prevented from placing another standard that may contain an aggressor feature adjacent to designations 5101 and 5102 of LEF symbol 510. In an embodiment, filler cells of varying sizes can be provided at standard cell library 106 and a filler cell of a suitable size can be selected based on the size or the location of the sensitive feature icon at the LEF view of the standard cell. A filler cell can be another functional standard cell used during operation of the device design that does not include an aggressor feature. A filler cell can be a functional standard cell that is not connected to other standard cells to implement a function of the device design. In still another embodiment, a filler cell may represent a non-functional area at the integrated circuit that is free of any functional devices, physical features, or that includes only non-aggressor features such as may be specified by lithographic feature-density guidelines.

Placement module 140 can also determine the relative placement of standard cells based on timing information provided by timing module 130. For example, placement module 140 can place standard cells that are included at a logic path having performance-critical timing behavior in close proximity to each other. In an embodiment, placement module 140 can place a filler cell adjacent to a sensitive feature designation at a standard cell only when the logic path that includes that standard cell fails to satisfy a device timing goals with a predetermined margin. For example, placement module 140 can be configured to place a filler cell adjacent to a sensitive feature designation only when the path containing the standard cell has a positive slack less than a predefined and programmable number of picoseconds, or whose slack is less than a predefined percentage of a governing clock signal period. Thus, a filler cell may only be required if the possible presence of an aggressor feature close to a standard cell can cause the timing slack of a logic path that includes the standard cell to become negative or fail to provide insufficient design margin. Note that a standard cell may be included in more than one encompassing logic path, and the timing slack of each path should be considered when determining if a filler cell is needed.

Figure 6:
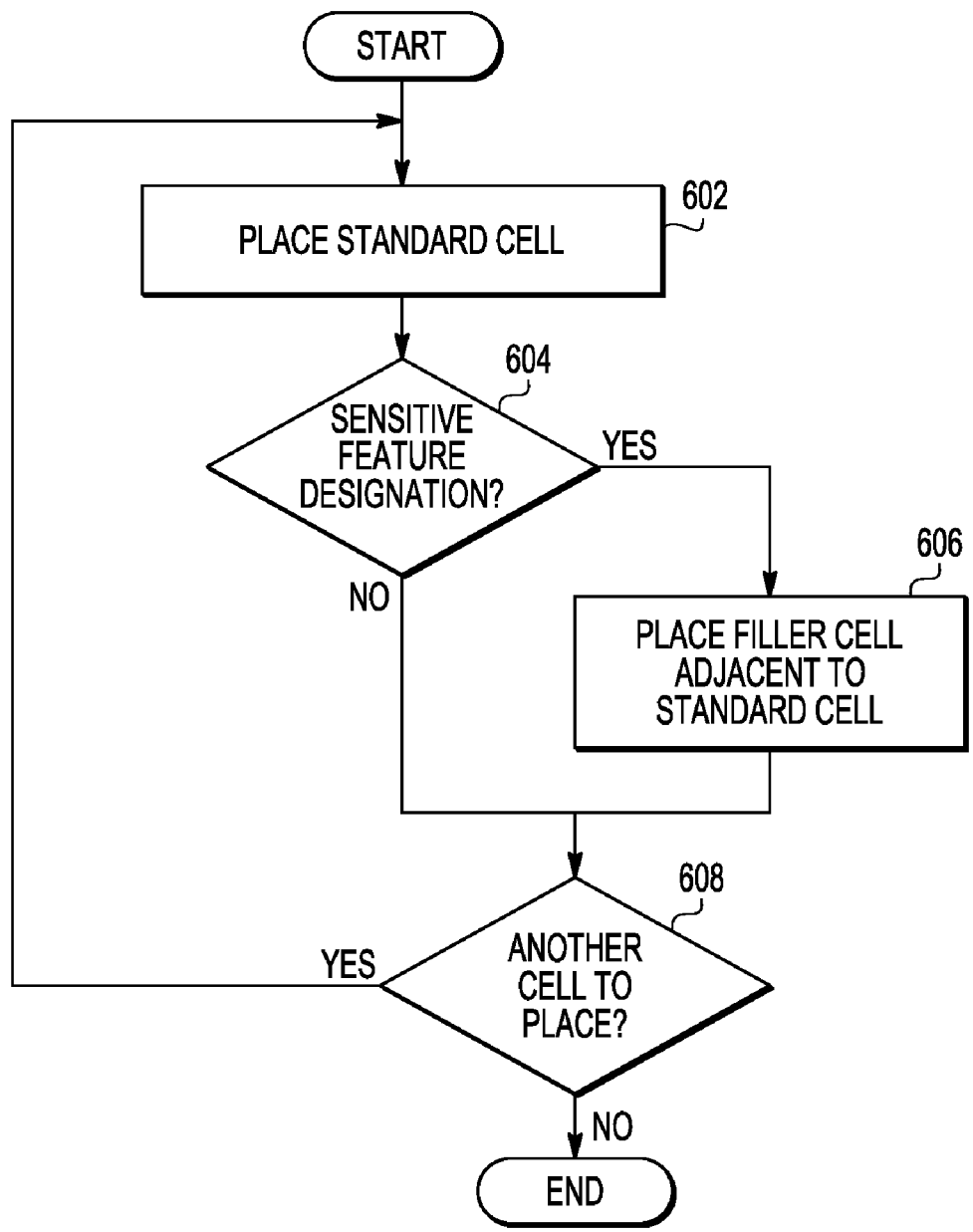
FIG. 6 is a flow diagram illustrating a method in accordance with a specific embodiment of the present disclosure.

FIG. 6 is a flow diagram illustrating a method 600 in accordance with a specific embodiment of the present disclosure. Method 600 starts at block 602 where a placement location of an instantiation of a standard cell at an integrated circuit data processing device design is identified. For example, block 602 may represent an action by placement module 140 of design system 100 whereby a LEF symbol associated with a standard cell is positioned at a data processing device design to represent an instantiation of a standard cells circuit at that location, a procedure referred as placement of the standard cell. The flow proceeds to decision block 604 where it is determined whether the placed standard cell includes one or more designations that identify a layout location at the standard cell associated with a sensitive feature of the standard cell. For example, a LEF view corresponding to the standard cell can include designation information to indicate the presence and location of a device at the standard cell that would be affected by an adjacent standard cell that included an aggressor feature. If the placed standard cell includes a sensitive feature, the flow proceeds to block 606, otherwise flow proceeds to decision block 608. At block 606, a placement location of a filler cell at the data processing device design adjacent to the instantiation of the standard cell is identified based on the designation. For example, placement module 140 can identify the location of a sensitive feature designation icon at a standard cell LEF symbol and place a filler cell adjacent to the icon, thereby assuring that a standard cell that does contain an aggressor feature is not placed at that location.

The flow proceeds from block 606 to decision block 608 where it is determined whether another standard cell included at the integrated circuit data processing device design remains to be placed. If all standard cells included at the device design have been placed, the flow is complete. If however another standard cell remains to be placed, the flow returns to block 602 where that cell is placed at the device design. Returning to decision block 604, if it is determined that that the standard cell placed at the device design does not include a sensitive feature designation, no filler cell is required to be placed adjacent to that standard cell, and the flow proceeds to decision block 608 where it can be determined whether another standard cell remains to be placed.

Figure 7:
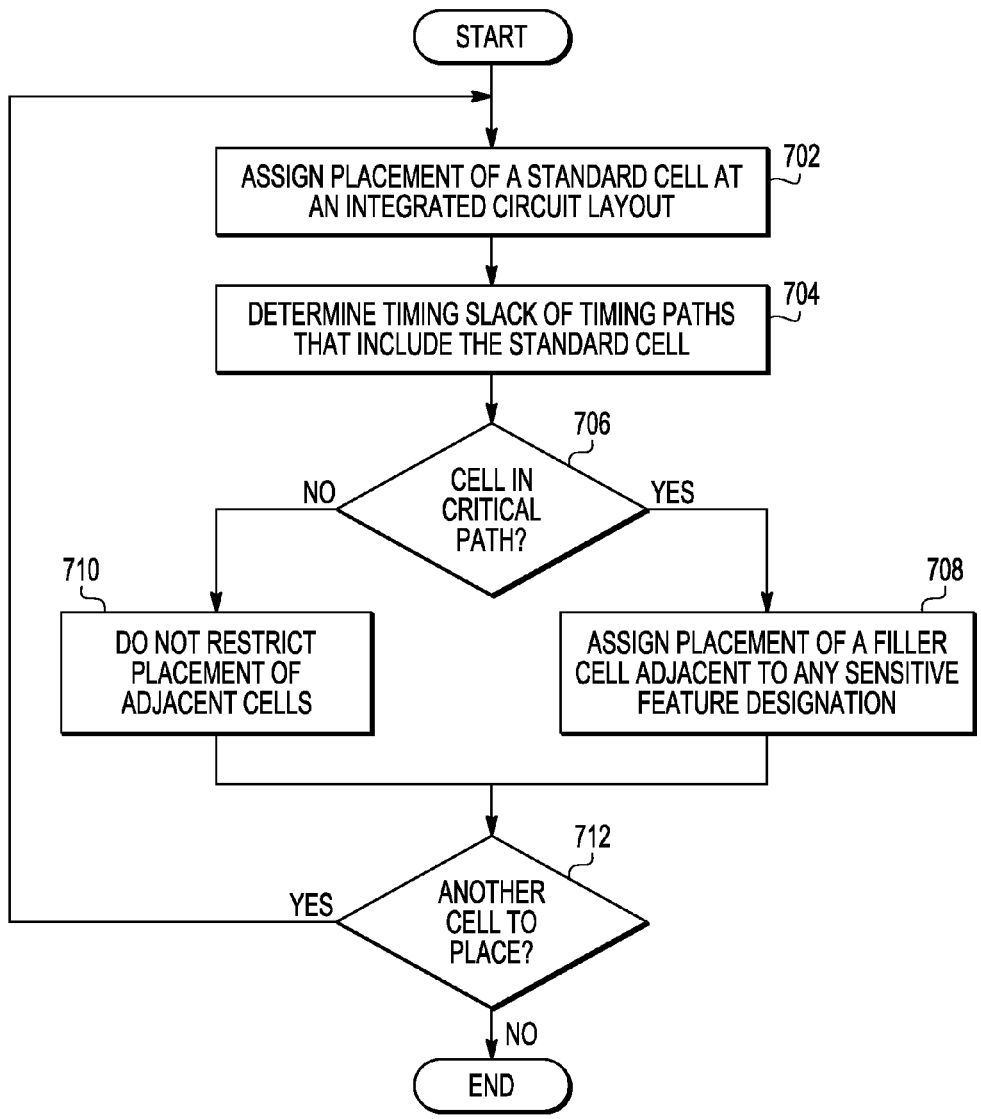
FIG. 7 is a flow diagram illustrating another method in accordance with a specific embodiment of the present disclosure.

FIG. 7 is a flow diagram illustrating a method 700 in accordance with a specific embodiment of the present disclosure. Method 700 begins at block 702 where the placement of a standard cell at an integrated circuit is assigned. For example, block 702 can represent an action by placement module 140 of design system 100 whereby a symbolic representation of a standard cell is placed at an integrated circuit data processing device design. The flow proceeds to block 704 where the timing slack associated with each logic path that includes the standard cell is determined. For example, timing module 130 of design system 100 can analyze the timing behavior of all encompassing logic paths and associate a worst-case timing slack with the standard cell based on the encompassing logic path that has the least margin (lowest slack).

The flow proceeds to decision block 706 where it is determined whether the standard cell is included in a critical path. For example, timing module 130 can designate that a logic path is a critical path if the timing slack associated with the path is insufficient, e.g., does not exceed a predetermined positive amount. If the standard cell is included at a critical path, the flow proceeds to block 708 where the placement of a filler cell is assigned adjacent to each respective sensitive feature designation included at the standard cell. If the standard cell is not included at a critical path, the flow proceeds to block 710 where the placement of standard cells adjacent to the standard cell is not restricted. The flow proceeds to decision block 712 where it is determined whether another standard cell included at the integrated circuit data processing device design remains to be placed. If all standard cells included at the device design have been placed, the flow is complete. If however another standard cell remains to be placed, the flow returns to block 702 where that cell is placed at the device design.

Figure 8:
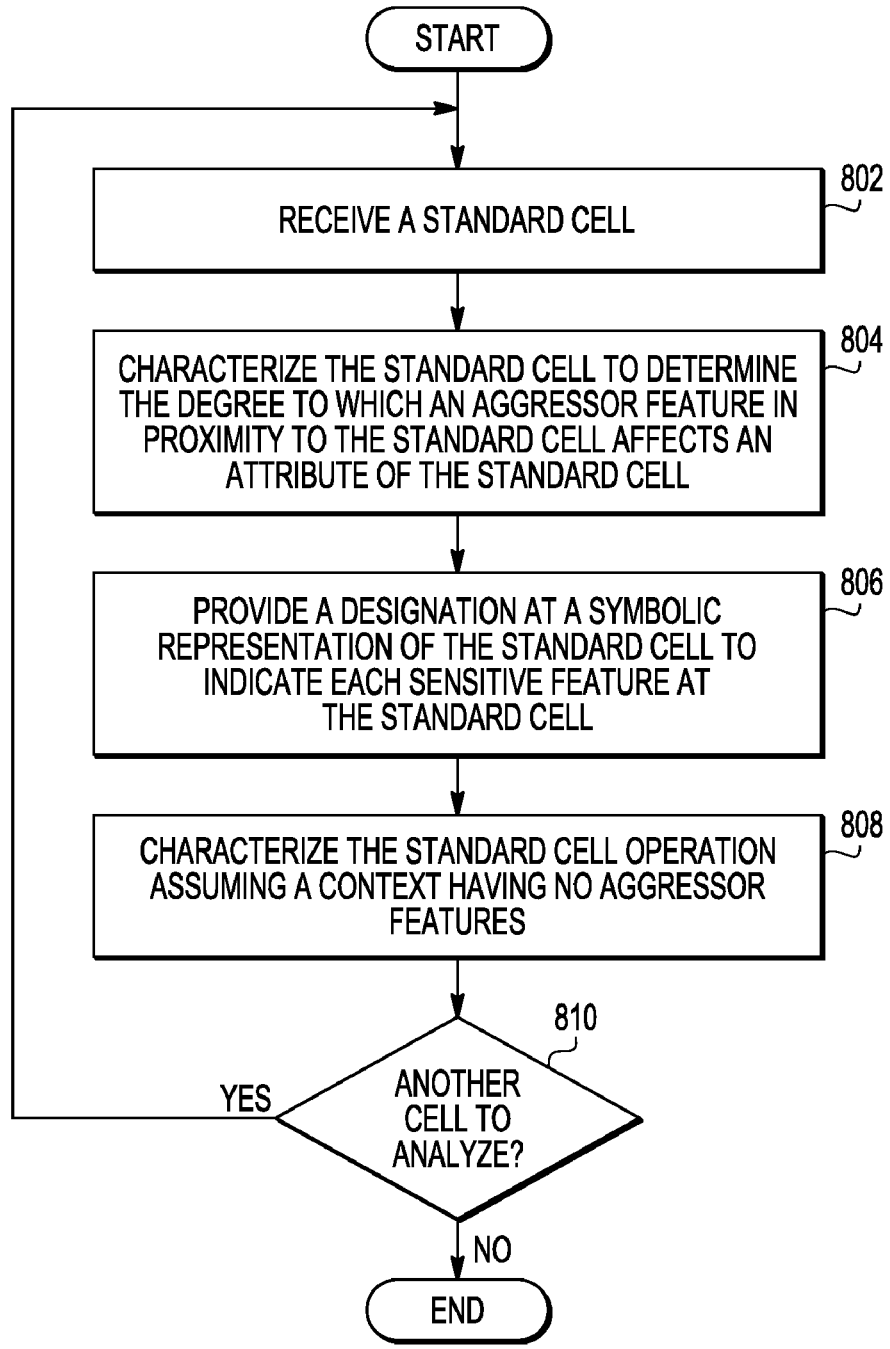
FIG. 8 is a flow diagram illustrating still another method in accordance with a specific embodiment of the present disclosure.

FIG. 8 is a flow diagram illustrating a method 800 in accordance with a specific embodiment of the present disclosure. Method 800 can be used to determine if a standard cell includes a sensitive feature and, if a sensitive feature is identified, to annotate the LEF view of the standard cell to indicate the location of sensitive features. Method 800 begins at block 802 where a standard cell is identified for characterization. For example, a standard cell included at standard cell library 106 can be received at characterization module 110. The flow proceeds to block 804 where the standard cell is analyzed to determine whether a sensitive feature at the standard cell is to effect the operation of the standard cell by an unacceptable amount in response to an aggressor feature located in close proximity to the standard cell. For example, characterization module 110 of design system 100 can determine if the standard cell includes a sensitive feature based on timing simulations of a transistor level netlist of the standard cell. The determination of whether the aggressor's affect on the standard cell is significant can be made based on a predetermined quantitative threshold, such as a percent deviation in a particular signal propagation delay of the standard cell, or based on other criteria.

The flow proceeds to block 806 where a designation identifying the presence and location of a sensitive feature is added to a symbolic representation, such as a LEF view, of the standard cell. For example, LEF module 120 can provide a designation icon at the LEF view of the standard cell to identify the presence and the location of a sensitive feature at the standard cell. If however the affect of the aggressor was not determined to be significant, no designation need be applied. The flow proceeds to block 808 where the operation of the standard cell is characterized based on an assumption that the standard cell will be placed in a context that does not include an aggressor feature. Accordingly, subsequent placement of an instantiation of the standard cell can include one or more filler cells placed adjacent to the standard cell so that no aggressor feature can significantly affect the operation of the standard cell. The flow proceeds to block 810 where it is determined if another standard cell remains to be analyzed to determine the presence of a sensitive feature. If another standard cell remains to be characterized, the flow returns to block 802 where another standard cell is received for characterization, else the flow is complete.

Figure 9:
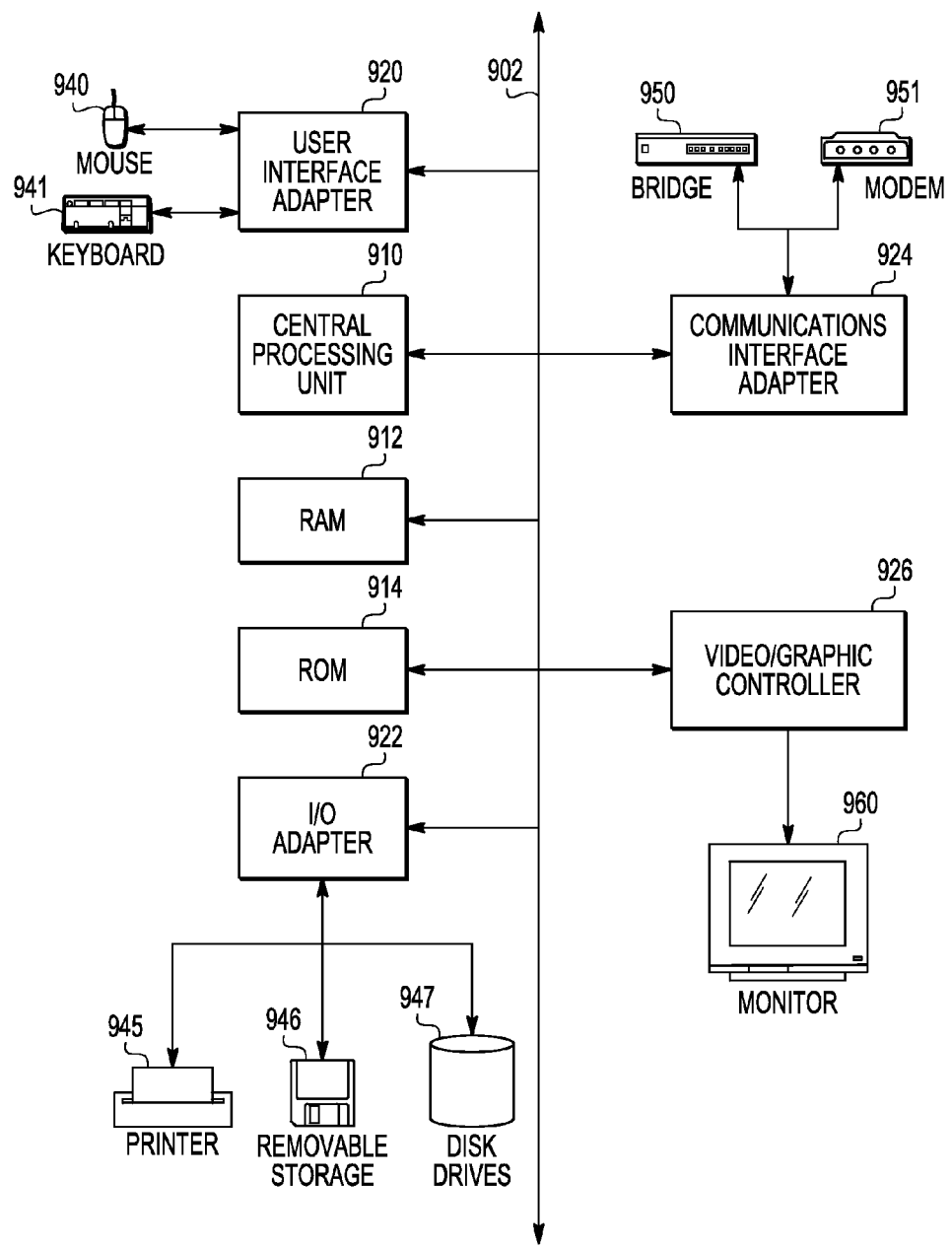
FIG. 9 is a block diagram illustrating a processing device in the form of a computer system in accordance with a specific embodiment of the present disclosure.

FIG. 9 illustrates, in block diagram form, a processing device in the form of a computer system 900. Computer system 900 is illustrated to include devices connected to each other a central processing unit 910, which may be a conventional proprietary data processor, memory including a random access memory 912, a read only memory 914, and an input output adapter 922, a user interface adapter 920, a communications interface adapter 924, and a multimedia controller 926. Generally, system 900 will be capable of implementing the system and methods described herein. For example, design file 104 to be accessed and manipulated by the method described herein can be stored at disk drive 947 or at memory 912 and accessed by CPU 910 in response to an instruction.

Input output (I/O) adapter 922 is further connected to, and controls, disk drives 947, printer 945, removable storage devices 946, as well as other standard and proprietary I/O devices. User interface adapter 920 can be considered to be a specialized I/O adapter. Adapter 920 is connected to a mouse 940, and a keyboard 941. In addition, user interface adapter 920 may be connected to other devices capable of providing various types of user control, such as touch screen devices. Communications interface adapter 924 is connected to a bridge 950 such as is associated with a local or a wide area network, and a modem 951. System bus 902 can be connected to various communication devices to access external information. Multimedia controller 926 will generally include a video graphics controller capable of displaying images upon the monitor 960, as well as providing audio to external components (not illustrated).

Figure 10:
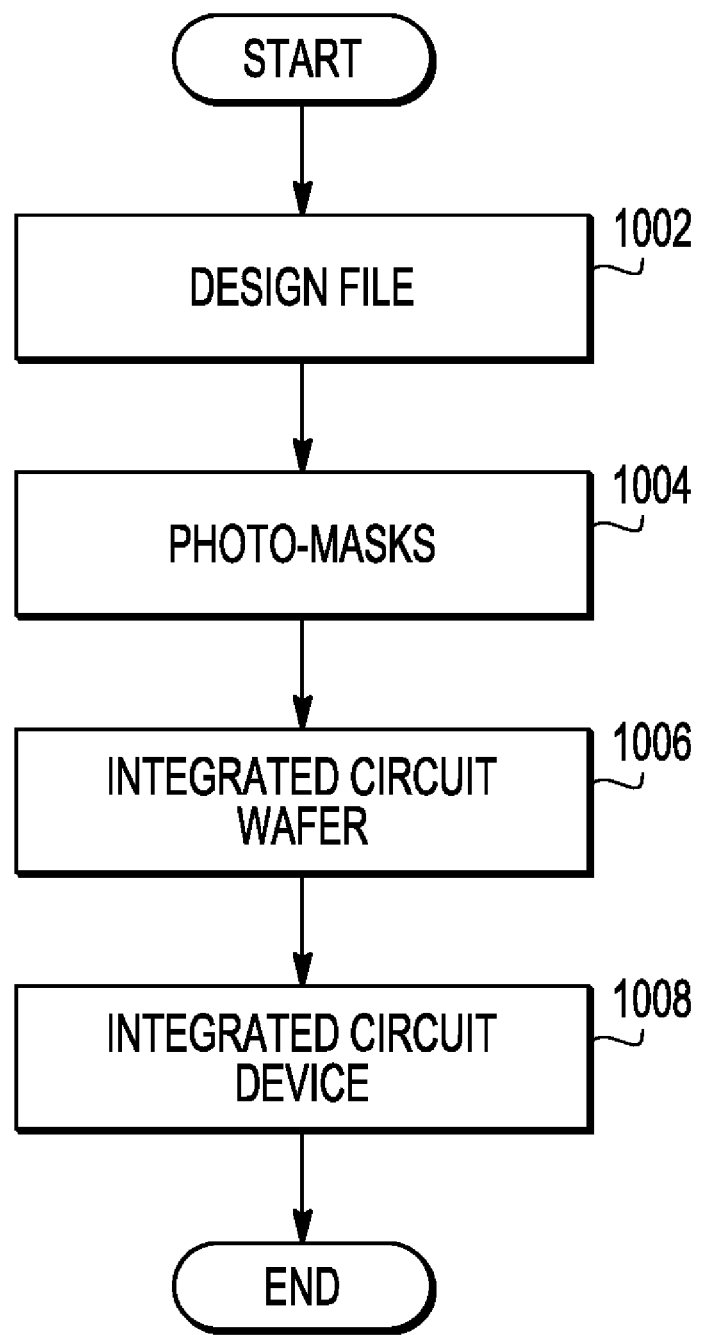
FIG. 10 is a flow diagram illustrating a method in accordance with a specific embodiment of the present disclosure.

FIG. 10 is a flow diagram illustrating a method in accordance with a specific embodiment of the present disclosure. At block 1002 information included at a design file, such as design file 104, is provided to a photo-lithography facility. For example, design file 104 can include information representing features of the completed integrated circuit such as feature 2021 and feature 2022. The flow proceeds to block 1004 where photo-masks are manufactured and provided to an integrated circuit wafer-fabrication facility. The flow proceeds to block 1006 where an integrated circuit wafer is manufactured using the photo-masks. The flow proceeds to block 1008 where integrated circuit devices are manufactured from integrated circuit die included at the integrated circuit wafer.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method implemented at a computer aided design tool comprising:
   placing, at the computer aided design tool, an instantiation of a standard cell at a location of a device design, the standard cell including a designation identifying a sensitive feature of the standard cell; and
   placing an instantiation of a filler cell at a selective location of the device design based on the designation.

2. The method of claim 1 wherein the sensitive feature is a transistor included at the standard cell.

3. The method of claim 1 further comprising:
   prior to placing the instantiation of the standard cell, analyzing the standard cell to identify the sensitive feature in response to determining that the operation of the standard cell is effected by an unacceptable amount in response to an aggressor feature being located proximate to the sensitive feature.

4. The method of claim 3 wherein the operation of the standard cell is a rate of signal propagation at the standard cell.

5. The method of claim 3 wherein the operation of the standard cell is an amount of sub-threshold leakage at the standard cell.

6. The method of claim 3 further comprising:
   in response to analyzing the standard cell, providing the designation to a symbolic representation of the standard cell based on identifying the sensitive feature.

7. The method of claim 1 further comprising:
   prior to placing the standard cell, characterizing the operation of the standard cell based on a contextual assumption that a filler cell is placed adjacent to the sensitive feature.

8. The method of claim 1, wherein placing the instantiation of the filler cell is responsive to determining timing information associated with a logic path of the device design that includes the standard cell.

9. The method of claim 1, wherein placing the instantiation of the filler cell is responsive to determining that a timing slack of a logic path of the device design that includes the standard cell is less than a predetermined amount of time.

10. The method of claim 1 further comprising forming an integrated circuit device based on the device design.

11. A method implemented at a computer aided design tool comprising:
    analyzing at the computer aided design tool, a standard cell to identify a sensitive feature at the standard cell that is to affect the operation of the standard cell by an unacceptable amount in response to an aggressor feature being located proximate to the standard cell; and
    providing a designation to a symbolic representation of the standard cell that identifies the location of the sensitive feature at the standard cell.

12. The method of claim 11 wherein the operation of the standard cell is a rate of signal propagation at the standard cell.

13. The method of claim 11 wherein the operation of the standard cell is an amount of sub-threshold leakage at the standard cell.

14. The method of claim 11 further comprising, characterizing the operation of the standard cell based on a contextual assumption that a filler cell is placed adjacent to the sensitive feature based on the designation.

15. The method of claim 11 further comprising:
identifying a placement location of an instantiation of the symbolic representation of the standard cell at a device design; and
identifying a placement location of a filler cell to be placed at the device design adjacent to the instantiation of the standard cell based on the designation.

16. The method of claim 15, wherein identifying the placement location is in response to determining the standard cell is associated with a logic path of the device design that does not meet a timing characteristic, wherein no filler cell is to be placed based upon the designation in response to the logic path meeting the timing characteristic.

17. A device comprising:
a memory;
a placement module coupled to the memory operable to:
place an instantiation of a standard cell at a device design, the standard cell including a designation identifying a layout location at the standard cell associated with a sensitive feature of the standard cell; and
place a filler cell at a location of the device based on the designation.

18. The device of claim 17 further comprising a characterization module coupled to the memory operable to analyze the standard cell prior to placing the standard cell to identify the sensitive feature as affecting the operation of the standard cell by an unacceptable amount in response to an aggressor feature being proximate to the standard cell.

19. The device of claim 17 further comprising a LEF module coupled to the memory operable to provide the designation to a symbolic representation of the standard cell, the location of the designation selected to provide an indication of the location of the sensitive feature.

20. The device of claim 17 further comprising a timing module coupled to the memory operable to determine a timing slack associated with a logic path that contains the instantiation of the standard cell, and wherein the placement module is further operable to identify the placement location of the filler cell at the device design based on the timing slack.

* * * * *